US012747500B2

(12) United States Patent
Winkler

(10) Patent No.: US 12,747,500 B2
(45) Date of Patent: Sep. 29, 2026

(54) LIQUID VAPORIZER

(71) Applicant: ASM IP Holding B.V., Almere (NL)

(72) Inventor: Jereld Lee Winkler, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/376,025

(22) Filed: Oct. 3, 2023

(65) Prior Publication Data

US 2024/0026538 A1 Jan. 25, 2024

Related U.S. Application Data

(63) Continuation of application No. 16/911,189, filed on Jun. 24, 2020, now Pat. No. 11,788,190.

(60) Provisional application No. 62/871,036, filed on Jul. 5, 2019.

(51) Int. Cl.

*C23C 16/455* (2006.01)
*C23C 16/448* (2006.01)
*H10P 72/00* (2026.01)

(52) U.S. Cl.

CPC .... *C23C 16/45557* (2013.01); *C23C 16/4481* (2013.01); *C23C 16/45527* (2013.01); *C23C 16/45544* (2013.01); *C23C 16/45561* (2013.01); *C23C 16/45587* (2013.01); *H10P 72/0402* (2026.01)

(58) Field of Classification Search

CPC ........ C23C 16/45561; C23C 16/45557; C23C 16/45544; C23C 16/4481; C23C 16/45587; C23C 16/45527; H01L 21/67017

See application file for complete search history.

(56) References Cited

U.S. PATENT DOCUMENTS 5,431,733 A * 7/1995 Shibuya .............. C23C 16/4482 118/715
6,663,716 B2 12/2003 Loan et al.
7,820,981 B2 10/2010 Horsky et al.
8,137,462 B2 3/2012 Fondurulia et al.
8,202,367 B2 6/2012 Tachibana et al.
9,994,955 B2 6/2018 Hidaka et al.
10,134,582 B2 11/2018 Ryu et al.
10,281,368 B2 5/2019 Thompson et al.
2002/0062789 A1 5/2002 Nguyen et al.
2003/0101938 A1* 6/2003 Ronsse ................ C23C 16/407 118/712
2003/0211736 A1 11/2003 Ludviksson et al.
2006/0207503 A1 9/2006 Meneghini et al.
2006/0222523 A1 10/2006 Valentian et al.

(Continued)

FOREIGN PATENT DOCUMENTS

JP H07268634 A 10/1995
JP 2004273693 A 9/2004

(Continued)

*Primary Examiner* — Joseph A Miller, Jr.

(74) *Attorney, Agent, or Firm* — Snell & Wilmer L.L.P.

(57) ABSTRACT

A semiconductor processing device is disclosed. The semiconductor device includes a reactor and a vaporizer configured to provide a reactant vapor to the reactor. The device can include a process control chamber between the vaporizer and the reactor. The device can include a control system configured to modulate a pressure in the process control chamber based at least in part on feedback of measured pressure in the process control chamber.

20 Claims, 4 Drawing Sheets

(56) References Cited

U.S. PATENT DOCUMENTS

2006/0269667 A1* 11/2006 Ma .................... C23C 16/45544
118/726
2009/0266296 A1 10/2009 Tachibana et al.
2010/0012219 A1 1/2010 Shibukawa et al.
2010/0078113 A1 4/2010 Sushihara et al.
2011/0100483 A1 5/2011 Nagata et al.
2012/0073672 A1 3/2012 Ding
2013/0089667 A1* 4/2013 Lai ...................... C23C 16/4488
427/255.28
2013/0312663 A1 11/2013 Khosla et al.
2015/0279693 A1* 10/2015 Jongbloed ............. C01B 15/017
134/42

FOREIGN PATENT DOCUMENTS

JP 2008133545 A 6/2008
JP 2017032087 A 2/2017
JP 2018112218 A 7/2018

* cited by examiner

LIQUID VAPORIZER

CROSS-REFERENCE TO RELATED APPLICATIONS

This application is a continuation of, and claims priority to and the benefit of, U.S. patent application Ser. No. 16/911,189, filed Jun. 24, 2020 and entitled "LIQUID VAPORIZER," which claims priority to U.S. Provisional Patent Application No. 62/871,036, filed Jul. 5, 2019, which are incorporated by reference herein.

BACKGROUND

Field

The field relates to a liquid vaporizer, for example, a liquid vaporizer for a semiconductor processing device.

Description of the Related Art

During semiconductor processing, various reactant vapors are fed into a reaction chamber. In some applications, the reactant vapors are stored in gaseous form in a reactant source vessel. In such applications, the reactant vapors are often gaseous at ambient pressures and temperatures. However, in some cases, the vapors of source chemicals that are liquid or solid at ambient pressure and temperature are used. These substances may be heated to produce sufficient amounts of vapor for the reaction process, such as vapor deposition. Chemical Vapor Deposition (CVD) for the semiconductor industry may call for continuous streams of reactant vapor, and Atomic Layer Deposition (ALD) may call for continuous streams or pulsed supply, depending on the configuration. In both cases it can be important to know with some accuracy the amount of reactant supplied per unit time or per pulse in order to control the doses and effect on the process.

For some solid and liquid substances, the vapor pressure at room temperature is so low that they have to be heated to produce a sufficient amount of reactant vapor and/or maintained at very low pressures. Once vaporized, it is important that the vapor phase reactant is kept in vapor form through the processing system so as to prevent undesirable condensation in reaction chamber, and in the valves, filters, conduits and other components associated with delivering the vapor phase reactants to the reaction chamber. Vapor phase reactant from such solid or liquid substances can also be useful for other types of chemical reactions for the semiconductor industry (e.g., etching, doping, etc.) and for a variety of other industries, but are of particular concern for metal and semiconductor precursors employed, e.g., in CVD or ALD. However, there remains a continuing demand for improved formation and delivery of reactant vapor to the reactor.

SUMMARY

In one embodiment, a semiconductor processing device is disclosed. The device can include a reactor and a vaporizer configured to provide a reactant vapor to the reactor. The device can include a process control chamber between the vaporizer and the reactor. The device can include a control system configured to modulate a pressure in the process control chamber based at least in part on feedback of measured pressure in the process control chamber.

In another embodiment, a device for forming a vaporized reactant is disclosed. The device can include a vaporizer configured to vaporize a reactant source into a reactant vapor, the vaporizer disposed in a first thermal zone at a first temperature. The device can include a process control chamber downstream of the vaporizer, the process control chamber disposed in a second thermal zone at a second temperature that is higher than the first temperature. The device can include a control system configured to maintain a first pressure in the vaporizer at or below a dew point pressure of the reactant vapor at the first temperature. The control system can be configured to modulate a pressure in the process control chamber based at least in part on feedback of measured pressure in the process control chamber.

In another embodiment, a method of forming a vaporized reactant is disclosed. The method can include supplying a reactant source to a vaporizer, the vaporizer disposed in a first thermal zone at a first temperature. The method can include vaporizing the reactant source to form a reactant vapor. The method can include maintaining a pressure in the vaporizer at or below a total vapor pressure of the reactant vapor at the first temperature. The method can include transferring the reactant vapor to a process control chamber, the process control chamber disposed in a second thermal zone at a second temperature that is greater than the first temperature. The method can include modulating a pressure in the process control chamber based at least in part on feedback of measured pressure in the process control chamber.

In another embodiment, a device for forming a vaporized reactant is disclosed. The device can include a vaporizer configured to form a reactant vapor from a liquid reactant. The device can include a process control chamber downstream of the vaporizer. The device can include a control system configured to modulate a pressure in the process control chamber based at least in part on feedback of measured pressure in the process control chamber.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Figure 1:
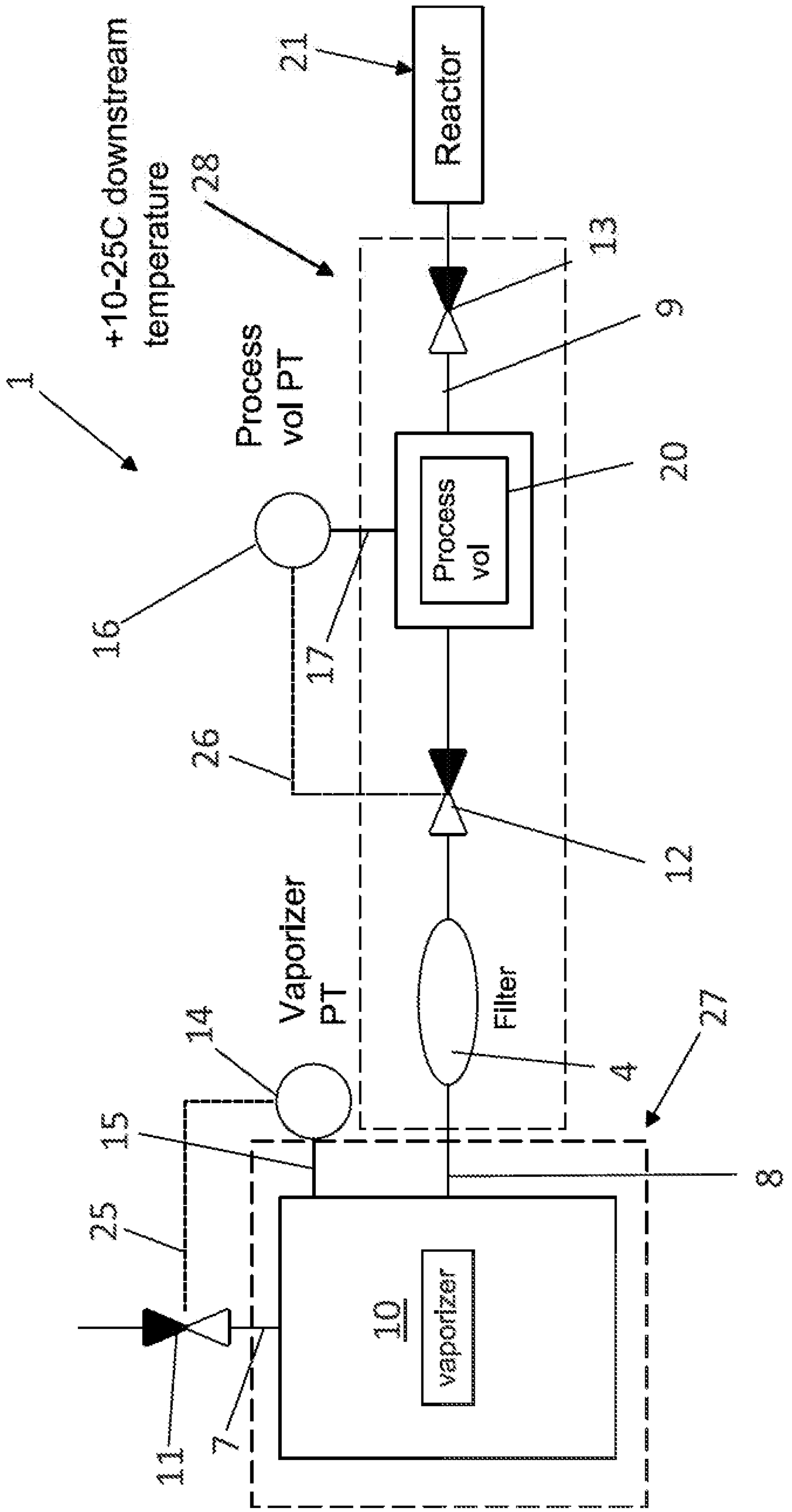
FIG. 1 is a schematic system diagram of a semiconductor processing device, according to various embodiments.

The embodiments disclosed herein relate to improved liquid vaporizers (e.g., direct liquid injection vaporizers) for vaporizing reactant liquids for use in a semiconductor processing device. The embodiments disclosed herein can be used in conjunction with any suitable type of semiconductor processing device, including an atomic layer deposition (ALD) device, a chemical vapor deposition (CVD) device, a metalorganic CVD (MOCVD) device, a physical vapor deposition device (PVD), etc.

For example, ALD is a method for growing highly uniform thin films onto a substrate. In a time-divided ALD reactor, the substrate is placed into reaction space free of impurities and at least two different precursors (reactant vapors) are injected in vapor phase alternately and repetitively into the reaction space. Reactant vapors can accordingly comprise a vapor that includes one or more precursors and one or more solvents. The film growth is based on alternating surface reactions that take place on the surface of the substrate to form a solid-state layer of atoms or molecules, because the reactants and the temperature of the substrate are chosen such that the alternately-injected vapor-phase precursor's molecules react only on the substrate with its surface layer. The reactants are injected in sufficiently high doses for the surface to be practically saturated during each injection cycle. Therefore, the process is highly self-regulating, being not dependent on the concentration of the starting materials, whereby it is possible to achieve extremely high film uniformity and a thickness accuracy of a single atomic or molecular layer. Similar results are obtained in space-divided ALD reactors, where the substrate is moved into zones for alternate exposure to different reactants. Reactants can contribute to the growing film (precursors) and/or serve other functions, such as stripping ligands from an adsorbed species of a precursor to facilitate reaction or adsorption of subsequent reactants.

The ALD method can be used for growing both elemental and compound thin films. ALD can involve alternate two or more reactants repeated in cycles, and different cycles can have different numbers of reactants. Pure ALD reactions tend to produce less than a monolayer per cycle, although variants of ALD may deposit more than a monolayer per cycle.

Growing a film using the ALD method can be a slow process due to its step-wise (layer-by-layer) nature. At least two gas pulses are alternated to form one layer of the desired material, and the pulses are kept separated from each other for preventing uncontrolled growth of the film and contamination of the ALD reactor. After each pulse, the gaseous reaction products of the thin-film growth process as well as the excess reactants in vapor phase are removed from the reaction space, or the substrate is removed from the zone that contains them. In time-divided examples, this can be achieved by pumping down the reaction space, by purging the reaction space with an inactive gas flow between successive pulses, or both. Purging employs a column of an inactive gas in the conduits between the reactant pulses. Purging is widely employed on production scale because of its efficiency and its capability of forming an effective diffusion barrier between the successive pulses. Regularly, the inert purging gas is also used as a carrier gas during reactant pulses, diluting the reactant vapor before it is fed into the reaction space.

Sufficient substrate exposure and good purging of the reaction space are desirable for a successful ALD process. That is, the pulses should be intense enough for the substrate to be practically saturated (in the flattened portion of the asymptotic saturation curve) and purging should be efficient enough to remove practically all precursor residues and undesired reaction products from the reactor. Purge times can be relatively long with respect to the precursor exposure times.

As explained above, liquid precursors (or precursor-solvent mixtures) can be evaporated in a vaporizer such as a liquid injection vaporizer, to form a reactant vapor to be delivered to the reactor or reaction chamber. However, in some devices, the pressure and temperature at portions of the system between the vaporizer and the reaction chamber may vary. Variations in the temperature and/or pressure within the process control chamber (or other such variations along the pathway between the vaporizer and the reaction chamber) may cause the vaporized reactant to condense into droplets of liquid. Condensation of reactant vapor upstream of the reaction chamber can result in the presence of liquid droplets within the reaction chamber, which can cause defects in the processed substrate (e.g., processed wafer) and reduce processing yields.

Moreover, in various semiconductor processing devices, the vaporizer is purged of reactant gases by supplying an inactive gas to the vaporizer between cycles. The vaporizer may have a large volume in some devices, and the time to purge such large volumes may significantly lower throughput. In some processing devices, excess particles may be created in the reaction chamber due to large pressure fluctuations resulting from inadequate flow rate control per pulse. In addition, it may be challenging to place a filter upstream of the reactor, which can lead to the transfer of liquid droplets to the reaction chamber and substrate.

Figure 2:
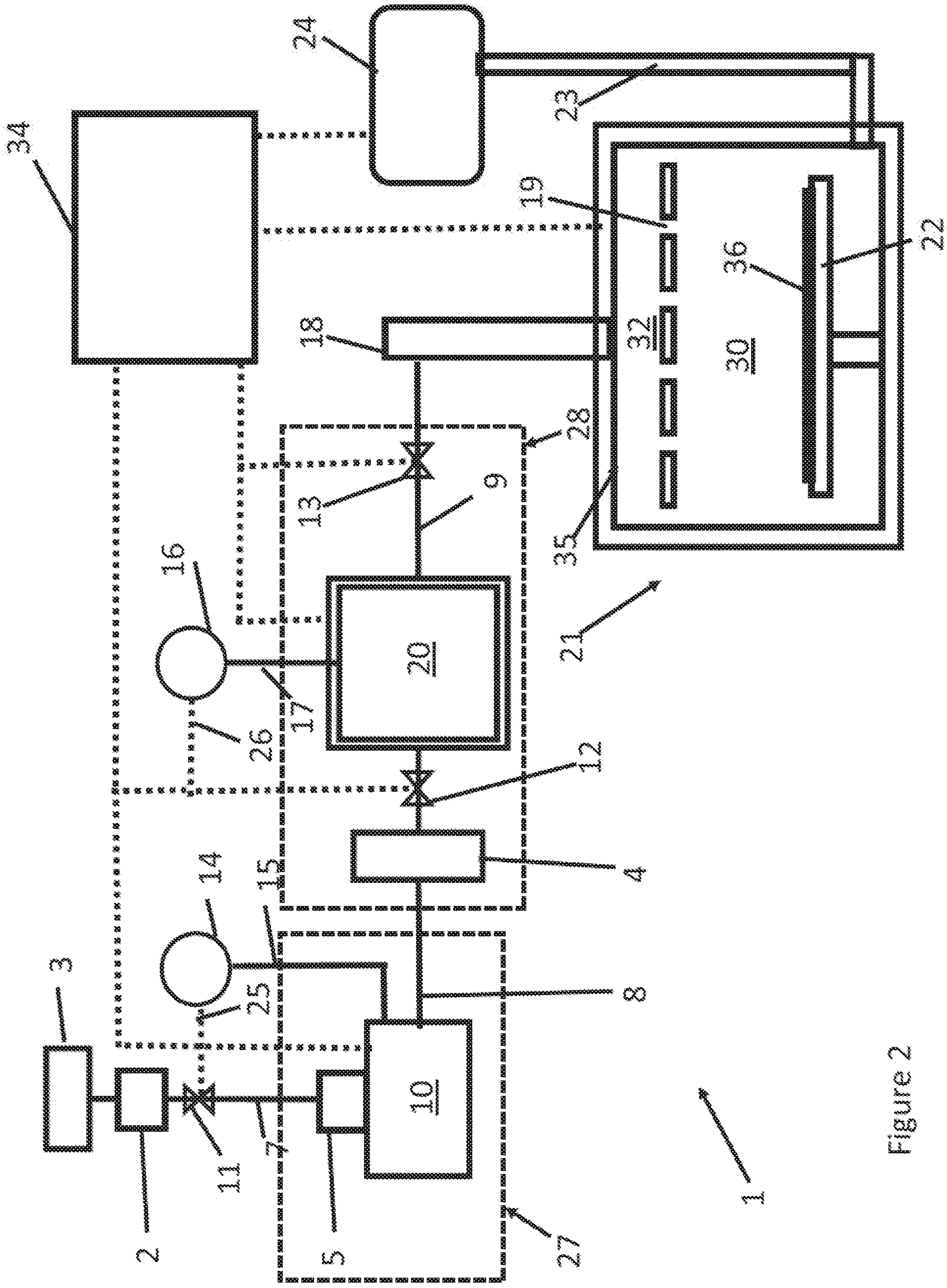
FIG. 2 is a schematic system diagram of the semiconductor processing device of FIG. 1, including a liquid reactant source.

FIG. 1 is a schematic system diagram of a semiconductor processing device 1, according to various embodiments. FIG. 2 is a schematic system diagram of the semiconductor processing device of FIG. 1, including a liquid reactant source 3 that supplies a liquid reactant to a liquid vaporizer 10. The liquid vaporizer 10 can supply vaporized reactant to a process control chamber 20, which is configured to ensure reactant remains in vapor form for supply to a reactor assembly, or reactor 21. The liquid reactant can comprise a liquid precursor, or a mixture of a liquid precursor (e.g., zirconium metalorganic, or Zr MO, such as zirconium amino alkoxides, for example, $Zr(dmae)_4$, $Zr(dmae)_2(OtBu)_2$, and $Zr(dmae)_2(OiPr)_2$, with dmae being dimethylaminoethoxide, $[OCH_2CH_2N(CH_3)_2]$) and a solvent (e.g., octane). The liquid reactant source 3 can supply the liquid reactant to the vaporizer 10 along a liquid injection line 7. A liquid mass flow controller (liquid MFC) 2 can be provided to control or meter the flow of liquid reactant along the liquid injection line 7. A first valve 11 can regulate the flow (e.g., pressure and/or flow rate) of the liquid reactant into the vaporizer 10. The first valve 11 can comprise any suitable type of valve. For example, in various embodiments, the first valve 11 can comprise an adjustable valve having a plurality of flow conductance settings to regulate the flow rate through the liquid injection line 7.

An atomizer or injector 5 can be provided along the liquid injection line 7 to atomize the liquid reactant into a high speed spray to be delivered to the vaporizer 10. As explained herein, the pressure and temperature of the vaporizer 10 can be controlled such that the injected liquid reactant is evaporated into reactant vapor. The reactant vapor can be supplied along a first reactant vapor supply line 8 to a filter 4. The filter can be configured to capture and evaporate any droplets that are present due to incomplete vaporization or condensation.

In various embodiments, as disclosed herein, the reactant vapor, which may be mixture of reactant and vaporized solvent, can be supplied along the first supply line 8, without using a separate inactive carrier gas supply. Omitting a separate inactive gas source to carry the reactant vapor through the first supply line 8 can beneficially reduce the costs and complexity associated with the device 1. Moreover, as explained above, the volume of the vaporizer 10 may be large, such that repeated purging of the vaporizer 10 reduces throughput. In the illustrated embodiment, the solvent vapor supplied along with the liquid reactant can serve to carry the reactant and form part of the reactant vapor from the vaporizer 10, which can obviate the need for a separate carrier gas supply to the vaporizer 10.

The process control chamber 20 can be disposed between the vaporizer 10 and the reactor 21. The process control chamber 20 can meter or control the amount of reactant vapor that is supplied to the reactor 21 along a second reactant vapor supply line 9. Accordingly, the process control chamber 20 can be configured to control the pulse-width and timing of pulse delivery to the reactor 21.

A second valve 12 can be disposed upstream of the process control chamber 20. In the illustrated embodiment, the second valve 12 can be disposed between the filter 4 and the process control chamber 20. In other embodiments, the second valve 12 can be disposed between the filter 4 and the vaporizer 10. The second valve 12 can comprise an adjustable valve to control flow conductance of the vaporized reactant. A third valve 13 can be disposed downstream of the process control chamber 20, e.g., between the process control chamber 20 and the reactor 21. The third valve 13 can comprise an adjustable valve to control flow conductance, in some embodiments. Other types of valves may be suitable in other embodiments.

The second reactant vapor supply line 9 can supply the reactant vapor to an inlet manifold 18 of the reactor 21. The inlet manifold 18 can supply the reactant vapor to a reaction chamber 30 of the reactor 21. A dispersion device 35, such as a showerhead as shown, or a horizontal injection device in other embodiments, can include a plenum 32 in fluid communication with a plurality of openings 19. The reactant vapor can pass through the openings 19 and to be supplied into the reaction chamber 30. A substrate support 22 can be configured, or sized and shaped, to support a substrate 36, such as a wafer, within the reaction chamber 30. The dispersed reactant vapor can contact the substrate and react to form a layer (e.g., a monolayer) on the substrate. The dispersion device 35 can disperse the reactant vapor in a manner so as to form a uniform layer on the substrate.

An exhaust line 23 can be in fluid communication with the reaction chamber 30. A vacuum pump 24 can apply suction to the exhaust line 23 to evacuate vapors and excess materials from the reaction chamber 30. The reactor 21 can comprise any suitable type of semiconductor reactor, such as an atomic layer deposition (ALD) device, a chemical vapor deposition (CVD) device, etc.

In the embodiment of FIGS. 1 and 2, a first pressure transducer 14 can monitor the pressure within the vaporizer 10 by way of a first transducer line 15. A second pressure transducer 16 can monitor the pressure within the process control chamber 20 by way of a second transducer line 17. A first feedback circuit 25 can electrically connect the first pressure transducer 14 with the first valve 11. A second feedback circuit 26 can electrically connect the second transducer 16 with the second valve 12. A control system 34 can control the operation of various components of the device 1. The control system 34 can comprise processing electronics configured to control the operation of one or more of the first valve 11, the second valve 12, the first pressure transducer 14, the second transducer 16, the third valve 13, the reactor 21 (and the various components therein), and the vacuum pump 24.

Although illustrated as a single structure in FIG. 2, it should be appreciated that the control system 34 can include a plurality of controllers or sub-systems that have processors, memory devices, and other electronic components that control the operation of the various components of the device 1. The term control system (or controller) includes any combination of individual controller devices and processing electronics that may be integrated with or connected to other devices (such as valves, sensors, etc.). Thus, in some embodiments, the control system 34 can include a centralized controller that controls the operation of multiple (or all) system components. In some embodiments, the control system 34 can comprise a plurality of distributed controllers that control the operation of one or more system components.

As explained above, inadequate vaporization or condensation can lead to deformities in film growth in the reaction chamber 30, which can reduce yield. Moreover, some processing devices may deliver reactant vapor from a vaporizer to a reactor without any intervening process control chamber or valving arrangements, which can lead to the delivery of liquid to the reaction chamber 30. Beneficially, the embodiment of FIGS. 1 and 2 can include feedback control of measured pressure in the vaporizer 10 and in the process control chamber 20.

As shown in FIG. 1, the device 1 can include a first thermal zone 27 that is maintained at a first temperature and a second thermal zone 28 that is maintained at a second temperature. In various embodiments, the second temperature of the second thermal zone 28 can be higher than the first temperature of the first thermal zone 27. In various embodiments, for example, the second temperature can be higher than the first temperature by a temperature difference in a range of 5° C. to 50° C., in a range of 5° C. to 35° C., or in a range of 10° C. to 25° C. The first thermal zone 27 can comprise the vaporizer 10. The second thermal zone 28 can comprise the filter 4, the second valve 12, the process control chamber 20, and the third valve 9, along with the supply lines that connect the components within the second thermal zone 28. If the thermal zones 27, 28 are separated, then portions of the supply line 8 between the zones can be provided with heater jackets to maintain the line at or above the temperature of the first thermal zone 27.

Placing the filter 4 within the heated second thermal zone 28 can beneficially elevate enhance the capture and evaporation of liquid droplets that may be delivered through the filter 4. The high temperature filter 4 can obviate the use of a separate droplet size control mechanism (e.g., high flow inactive gas injection) or flash contactless injection. Moreover, placing the vaporizer 10 and process control chamber 20 in heated zones that are at different temperatures can enable the device 1 to fine tune reactor process parameters. For example, the first and second valves 11, 12 can be adjusted by the control system 34 to increase or decrease solvent and precursor flow rate into the reactor in order to obtain desired processing reactor parameters.

For example, a first pressure set point for the vaporizer 10 can be calculated based at least in part on a particular reactant-solvent mixture, the temperature of the first thermal zone 27, the volume of the vaporizer 10, the flow rate through the vaporizer 10, and the dew point pressure (e.g., the approximate maximum pressure at which the reactant remains in vapor form, as used herein) of the reactant material at the temperature of the vaporizer 10. The calculated first pressure set point can set an upper bound for the pressure within the vaporizer 10, and can be input into the control system 34. The first pressure transducer 14 can monitor the pressure in the vaporizer 10, and can feed back the measured pressure to the first valve 11 along the first feedback circuit 25, and/or the control system 34. The feedback circuit 25 and/or the control system 34 can use any suitable closed loop control techniques to maintain the pressure in the vaporizer 10 at or below the first pressure set point. For example, the control system 34 can calculate a difference between the measured pressure and the first pressure set point. Based on the calculated difference, the control system 34 can send a control signal to the first valve 11 to adjust the flow conductance setting of the valve 11 to adjust the pressure of the vaporizer 10 to maintain the pressure at or below the reactant dew point pressure at the first temperature.

As an example of determining a pressure set point for the valve 11 (or valve 12), the specific gravity of the mixture of reactant and solvent can be calculated. In a first example, for a mixture that utilizes 50% zirconium metal-organic (ZrMO) (e.g., zirconium amino alkoxides) as the reactant and 50% octane as the solvent, the specific gravity can be about 0.961. In this example, the flow rate of the mixture can be about 0.00133 g-liquid/msec. For a set temperature of 150° C. in the first thermal zone 27, the corresponding vapor pressure of ZrMO can be about 45 torr. The corresponding total vapor pressure for a vaporizer 10 having a volume of 0.5 L is approximately 159 torr, which can be the first pressure set point for the first valve 11. The pressure set points will of course vary, depending on the mixture composition and process parameters. As a second example with process parameters the same as for the first example, a 20% ZrMO reactant and 80% octane solvent mixture has a total vapor pressure of about 500 torr.

Similarly, a second pressure set point for the process control chamber 20 can be calculated based at least in part on the reactant-solvent mixture, the temperature of the second thermal zone 28, the volume of the process control chamber 20, the flow rate through the process control chamber 20, and the known dew point pressure of the reactant material at the temperature of the process control chamber 20. The calculated second pressure set point can set an upper bound for the pressure within the process control chamber 20, and can be input into the control system 34. The second pressure transducer 16 can monitor the pressure in the process control chamber 20, and can feed back the measured pressure to the second valve 12 along the second feedback circuit 26, and/or the control system 34. The second feedback circuit 26 and/or the control system 34 can use any suitable closed loop control techniques to maintain the pressure in the process control volume 20 at or below the second pressure set point. For example, the control system 34 can calculate a difference between the measured pressure and the second pressure set point. Based on the calculated difference, the control system 34 can send a control signal to the second valve 12 to adjust the flow conductance setting of the valve 12 to adjust the pressure of the process control chamber 20 to maintain the pressure at or below the reactant dew point pressure at the second temperature.

Accordingly, the valves 11, 12, the pressure transducers 14, 16, and the feedback circuits 25, 26 can accurately control the respective pressures in the vaporizer 10 and the process control chamber 20 to prevent condensation and inadequate vaporization. Furthermore, because two feedback circuits 25, 26 are provided for two thermal zones 27, 28 maintained at different temperatures, the device 1 can fine tune reactor processing parameters and reactant flow rates. For example, in some embodiments, the control system 34 can be configured to step down a pressure of the reactant vapor upstream of the process control chamber 20. Since the second temperature of the second thermal zone 28 may be higher than the first temperature of the first thermal zone 27, the reactant vapor does not condense even at lower pressures, while the step down in pressure can help modulate the dose of reactant gas to the reactor and stabilize the reaction process. In other embodiments, the control system 34 can be configured to step up, or otherwise adjust, the pressure upstream of the process control chamber 20 in order to tune reaction processing parameters.

Figure 3:
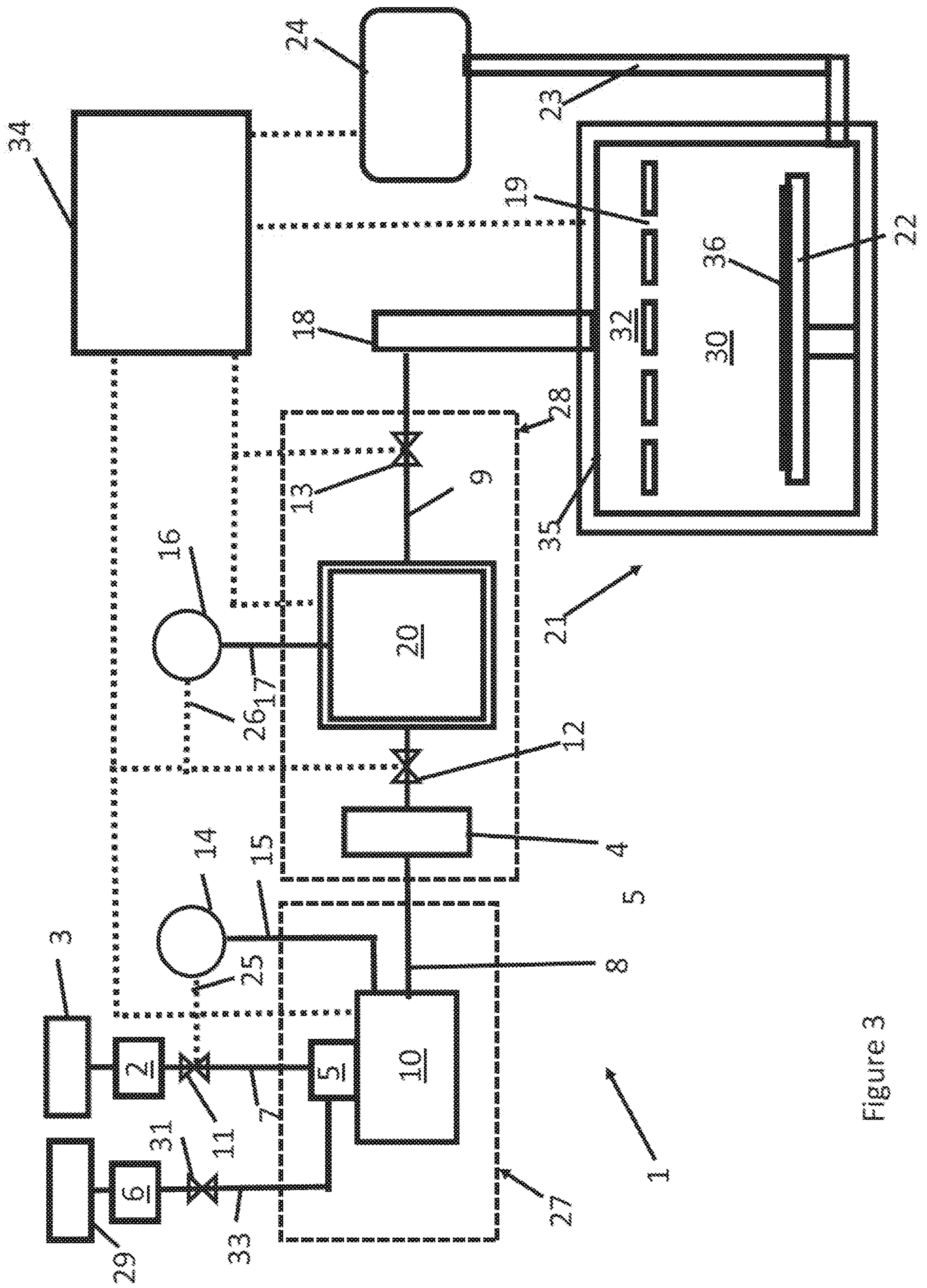
FIG. 3 is a schematic system diagram of a semiconductor processing device including a liquid reactant source and an inactive gas source, according to another embodiment.

FIG. 3 is a schematic system diagram of the semiconductor processing device of FIG. 1, including a liquid reactant source 3 and an inactive gas source 29. Unless otherwise noted, the components of FIG. 3 may be the same as or generally similar to like-numbered components of FIGS. 1 and 2. Unlike the embodiment of FIGS. 1 and 2, in which only the reactant source 3 is present, in FIG. 3, the device 1 can supply inactive carrier gas to the injector 5 of the vaporizer 10 along an inactive gas line 33. As shown, a gas mass flow controller (MFC) 6 can meter the supply of gas along the inactive gas line 33. A fourth valve 31 can be provided along the inactive gas line 33 to regulate the flow of the inactive gas to the vaporizer 10. The fourth valve 31 can comprise an adjustable valve having a plurality of flow conductance settings in some embodiments. In other embodiments, the fourth valve 31 can comprise a binary, on/off valve, in which the valve 31 either permits or blocks flow of the inactive gas along the inactive gas line 33. In the embodiment of FIG. 3, the inactive gas can assist in supplying the reactant vapor to the reactor 21. For example, the inactive gas can assist in atomizing the reactant liquid in the injector 5, which improves the efficiency of vaporization.

Figure 4:
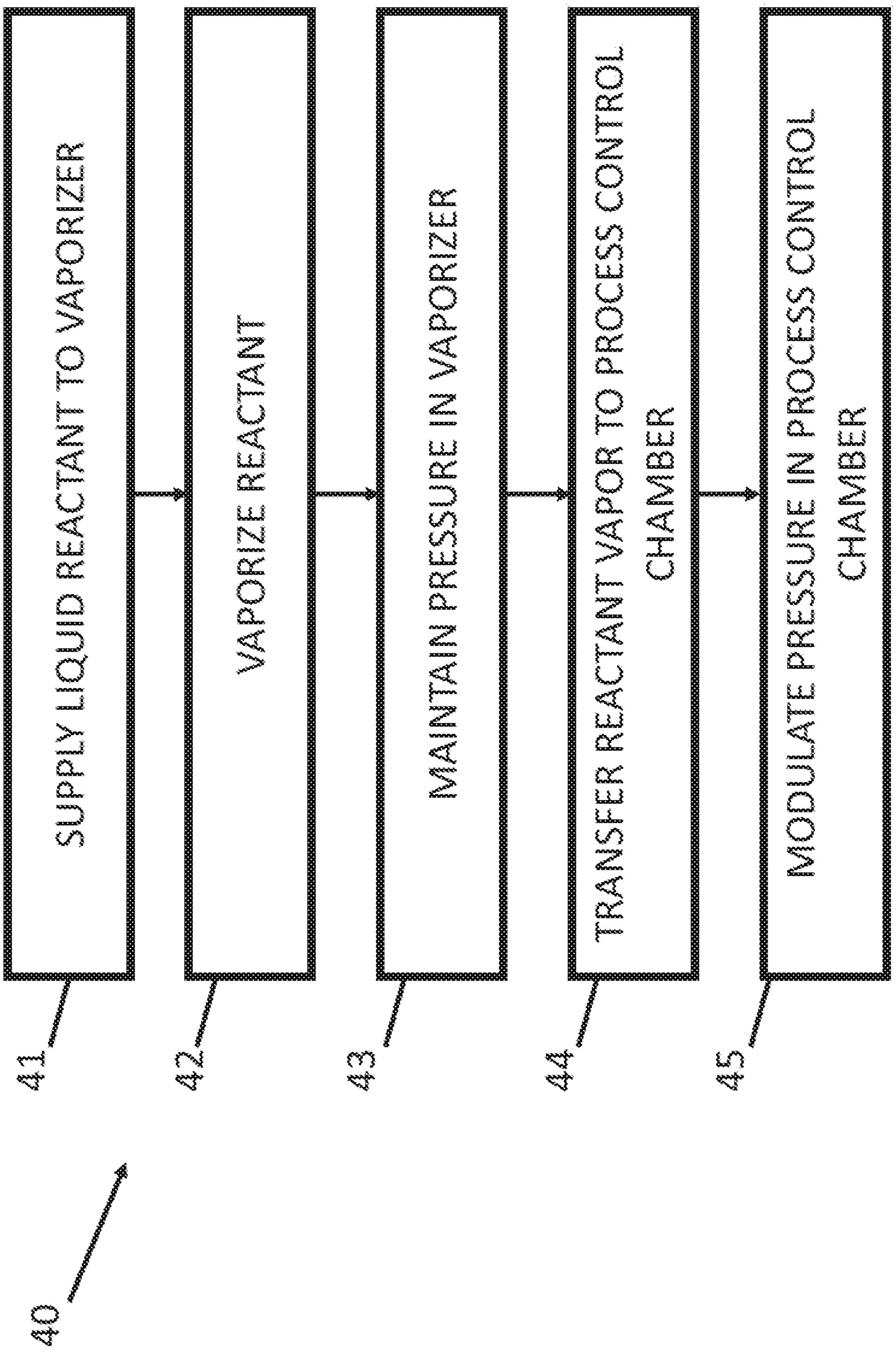
FIG. 4 is a flowchart illustrating a semiconductor processing method, according to various embodiments.

FIG. 4 is a flowchart illustrating a semiconductor processing method 40, according to various embodiments. The method 40 can begin in a block 41, in which a liquid reactant is supplied to a vaporizer. The vaporizer can be disposed in a first thermal zone at a first temperature. Turning to a block 42, the reactant can be vaporized in the vaporizer to form a reactant vapor. For the illustrated direct liquid injection embodiments, vaporizing can include atomizing as well as heating. For example, atomizing can be through a contactless injector that atomizes while mixing with high speed inert gas flow, while vaporization of the atomized or aerosolized reactant can be aided by one or more heaters (e.g., radiant heaters) that apply thermal energy to the vaporizer to increase its temperature.

In a block 43, a pressure in the vaporizer can be maintained at or below a dew point pressure of the reactant vapor (including any solvent) at the first temperature. As explained herein, in various embodiments, a first valve can be disposed upstream of the vaporizer. A first pressure transducer can be in fluid communication with the vaporizer. A first feedback control circuit can electrically connect the first pressure transducer and the first valve. The first feedback control circuit can ensure that the pressure is below a pressure set point so as to prevent condensation and incomplete evaporation.

Turning to a block 44, the reactant vapor can be transferred to a process control chamber downstream of the vaporizer. The process control chamber can be disposed in a second thermal zone at a second temperature that is greater than the first temperature. The process control chamber can meter the supply (or pulse) of reactant vapor to a reactor which can be disposed downstream of the process control chamber.

In a block 45, the pressure in the process control chamber can be modulated based at least in part on feedback of measured pressure in the process control chamber. The pressure in the process control chamber can be maintained at or below the maximum pressure of the reactant vapor (including any solvent) at the second temperature in order to maintain the vapor state of the reactant vapor. As explained herein, in various embodiments, a second valve can be disposed upstream of the process control chamber. A second pressure transducer can be in fluid communication with the process control chamber. A second feedback control circuit can electrically connect the second pressure transducer and the second valve. The second feedback control circuit can ensure that the pressure is below a pressure set point so as to prevent condensation and incomplete evaporation. Moreover, in some embodiments, the pressure set point upstream of the process control chamber can be stepped down from the vaporizer so as to modulate process parameters of the reactor processes.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the disclosed embodiments. Moreover, not all of the features, aspects and advantages described herein above are necessarily required to practice the present embodiments.

What is claimed is:

1. A method comprising:
- supplying a reactant to a vaporizer through a first valve, the vaporizer disposed in a first thermal zone at a first temperature;
- vaporizing the reactant to form a reactant vapor;
- maintaining, by a first control circuit of a control system, a pressure in the vaporizer at or below a total vapor pressure of the reactant vapor using closed loop control based on feedback of measured pressure in the vaporizer and the first temperature;
- transferring the reactant vapor through a filter downstream of the vaporizer;
- transferring the reactant vapor to a process control chamber through a second valve, wherein the process control chamber comprises a chamber having a volume configured to maintain the reactant vapor in vapor form, wherein the filter is between the vaporizer and the process control chamber;
- one of stepping down or stepping up, by the control system, the reactant vapor pressure upstream of the process control chamber;
- modulating, by a second control circuit of the control system, a pressure in the process control chamber using closed loop control based at least in part on feedback of measured pressure in the process control chamber and the second temperature of the process control chamber;
- flowing the reactant vapor from the process control chamber through a third valve to a reactor, wherein the process control chamber is coupled upstream from the reactor, and wherein the reactor is in fluid communication with the vaporizer; and
- maintaining a second thermal zone to a second temperature greater than the first temperature, wherein the second thermal zone comprises the filter, the second valve, the process control chamber, the third valve, and supply lines connecting the filter to the third valve.

2. The method of claim 1, further comprising maintaining, by the second control circuit of the control system, the pressure in the process control chamber at or below a dew point pressure of the reactant vapor at the second temperature.

3. The method of claim 1, wherein the maintaining the pressure in the vaporizer, comprises:
- calculating, by the first control circuit of the control system, a first pressure set point for the vaporizer based on the first temperature, a volume of the vaporizer, or a dew point pressure of the reactant vapor;
- measuring the pressure in the vaporizer via a first transducer coupled to the vaporizer;
- comparing, by the control system, the measured pressure in the vaporizer with the first pressure set point; and
- adjusting a flow of the reactant to the vaporizer in response to a difference between the measured pressure in the vaporizer and the first pressure set point.

4. The method of claim 1, wherein the modulating the pressure in the process control chamber, comprises:
- calculating, by the second control circuit of the control system, a second pressure set point for the process control chamber based on the second temperature, the volume of the process control chamber, or a dew point pressure of the reactant vapor;
- measuring the pressure in the process control chamber via a second transducer coupled to the process control chamber;
- comparing, by the control system, the measured pressure in the process control chamber with the second pressure set point; and
- adjusting a flow of the vapor reactant to the process control chamber in response to a difference between the measured pressure in the process control chamber and the second pressure set point.

5. A method comprising:
- vaporizing a reactant in a vaporizer to form a reactant vapor, wherein the vaporizer is disposed in a first thermal zone at a first temperature;
- transferring the reactant vapor through a filter downstream of the vaporizer;
- transferring the reactant vapor through a first valve to a process control chamber, wherein the process control chamber comprises a chamber having a volume configured to maintain the reactant vapor in vapor form, wherein the filter is between the vaporizer and the process control chamber;
- one of stepping down or stepping up, by a control system, a reactant vapor pressure upstream of the process control chamber;
- modulating, by a second control circuit of the control system, a pressure in the process control chamber using closed loop control based at least in part on feedback of measured pressure in the process control chamber and the second temperature of the process control chamber;
- maintaining, by a first control circuit of the control system, a pressure in the vaporizer using closed loop control based at least in part on feedback of measured pressure in the vaporizer and the first temperature;
- flowing the reactant vapor from the process control chamber through a second valve to a reactor, wherein the process control chamber is coupled upstream from the reactor, and wherein the reactor is in fluid communication with the vaporizer; and
- maintaining a second thermal zone to a second temperature greater than the first temperature, wherein the second thermal zone comprises the filter, the first valve, the process control chamber, the second valve, and supply lines connecting the filter to the second valve.

6. The method of claim 5, further comprising calculating, by the first control circuit of the control system, a first pressure set point for the vaporizer based on at least one of the reactant vapor, the first temperature, a volume of the vaporizer, or a dew point pressure of the reactant vapor.

7. The method of claim 6, further comprising measuring a pressure in the vaporizer via a first transducer coupled to the vaporizer, and comparing, by the control system, the measured pressure in the vaporizer with the first pressure set point.

8. The method of claim 7, wherein in response to detecting a difference between the measured pressure in the vaporizer and the first pressure set point, the method further comprises adjusting a flow of the reactant to the vaporizer.

9. The method of claim 6, further comprising calculating, by the second control circuit of the control system, a second pressure set point for the process control chamber based on at least one of the second temperature, the volume of the process control chamber, or a dew point pressure of the reactant vapor.

10. The method of claim 9, further comprising measuring the pressure in the process control chamber via a transducer coupled to the process control chamber, and comparing, by the second control circuit of the control system, the measured pressure in the process control chamber with the second pressure set point, wherein the modulating the pressure in the process control chamber occurs in response to detecting, by the second control circuit of the control system, a difference between the measured pressure in the process control chamber and the second pressure set point.

11. The method of claim 1, wherein the second temperature is higher than the first temperature by a temperature difference in a range of 5° C. to 50° C.

12. A processing method, comprising:

maintaining a vaporizer at a first temperature;

vaporizing a reactant in the vaporizer to form a reactant vapor;

measuring a pressure in the vaporizer;

maintaining using closed loop control, by a first control circuit of a control system, a pressure in the vaporizer at or below a dew point pressure of the reactant vapor, based at least in part on the first temperature of the vaporizer and the measured pressure in the vaporizer;

maintaining a process control chamber at a second temperature that is greater than the first temperature in a range of 5° C. to 50° C., wherein the process control chamber is downstream of the vaporizer and comprises a chamber having a volume configured to maintain the reactant vapor in vapor form;

transferring the reactant vapor through a filter downstream of the vaporizer, wherein the filter is between the vaporizer and the process control chamber, wherein the filter is maintained at the second temperature;

one of stepping down or stepping up, by the control system, the reactant vapor pressure upstream of the process control chamber;

transferring the reactant vapor to the process control chamber;

measuring a pressure in the process control chamber;

modulating, by a second control circuit of the control system, a pressure in the process control chamber using closed loop control based at least in part on the second temperature of the process control chamber and the measured pressure in the process control chamber; and flowing the reactant vapor from the process control chamber to a reactor, wherein the process control chamber is coupled upstream from the reactor, and wherein the reactor is in fluid communication with the vaporizer.

13. The method of claim 12, wherein the maintaining the pressure in the vaporizer comprises calculating, by the first control circuit of the control system, a first pressure set point for the vaporizer based on the first temperature in the vaporizer, a volume of the vaporizer, or the dew point pressure of the reactant vapor.

14. The method of claim 13, wherein measuring the pressure in the vaporizer comprises utilizing a first transducer coupled to the vaporizer.

15. The method of claim 14, wherein the maintaining the pressure in the vaporizer further comprises comparing, by the first control circuit of the control system, the measured pressure in the vaporizer with the first pressure set point, and in response to a difference between the measured pressure in the vaporizer and the first pressure set point, adjusting a flow of the reactant to the vaporizer.

16. The method of claim 12, further comprising calculating, by the second control circuit of the control system, a second pressure set point for the process control chamber based on the reactant vapor, the second temperature of the process control chamber, the volume of the process control chamber, or the dew point pressure of the reactant vapor.

17. The method of claim 16, wherein measuring the pressure in the process control chamber comprises utilizing a second transducer coupled to the process control chamber.

18. The method of claim 17, further comprising comparing, by the control system, the measured pressure in the process control chamber with the second pressure set point.

19. The method of claim 18, wherein the modulating the pressure in the process control chamber occurs in response to detecting, by the control system, a difference between the measured pressure in the process control chamber and the second pressure set point.

20. The method of claim 1, wherein the filter is configured to capture and evaporate any droplets that are present.

* * * * *